United States Patent
Shimoji et al.

[11] Patent Number: 5,985,716
[45] Date of Patent: Nov. 16, 1999

[54] METHOD FOR MANUFACTURING A SEMICONDUCTOR DEVICE

[75] Inventors: Noriyuki Shimoji; Masataka Tsuruta; Takuya Yonezawa, all of Kyoto, Japan

[73] Assignee: Rohm Co., Ltd., Kyoto, Japan

[21] Appl. No.: 08/718,275

[22] Filed: Sep. 20, 1996

[30] Foreign Application Priority Data

Sep. 21, 1995 [JP] Japan ................................. 7-242579

[51] Int. Cl.⁶ .............................................. H01L 21/8247
[52] U.S. Cl. ........................... 438/257; 438/970; 438/738
[58] Field of Search ................................. 438/257–267, 438/970, 737, 738, 740

[56] References Cited

U.S. PATENT DOCUMENTS

| | | |
|---|---|---|
| 5,070,032 | 12/1991 | Yuan et al. . |
| 5,087,584 | 2/1992 | Wada et al. . |
| 5,336,628 | 8/1994 | Hartmann . |
| 5,607,868 | 3/1997 | Chida et al. . |
| 5,656,527 | 8/1997 | Choi et al. ................................. 438/258 |
| 5,686,333 | 11/1997 | Sato . |
| 5,789,294 | 8/1998 | Choi ........................................ 438/258 |

FOREIGN PATENT DOCUMENTS

WO 96/01499   1/1996   WIPO .

*Primary Examiner*—Richard Booth
*Attorney, Agent, or Firm*—Merchant & Gould P.C.

[57] ABSTRACT

A polysilicon layer 38 located upward of a local oxidation of silicon (LOCOS) layer 20 is removed partially when selective etching of the polysilicon layer 38 for forming a floating gate FG is carried out by carrying out anisotropic etching. The etching is stopped when only the polysilicon layer 38 is removed. Wet-etching usually carried out at the final phase of the anisotropic etching process is not performed. In this way, the LOCOS layer 20 located underneath the polysilicon layer 38 is not over-etched. As a result, an inter layer 34 is not formed in a shape of eaves on the LOCOS layer 20 when the inter layer 34 is formed. Therefore, the probability of causing stringers underneath the inter layer 34 is remarkably low.

20 Claims, 8 Drawing Sheets

FIG.1A (Section P1-P1) (Section P2-P2)
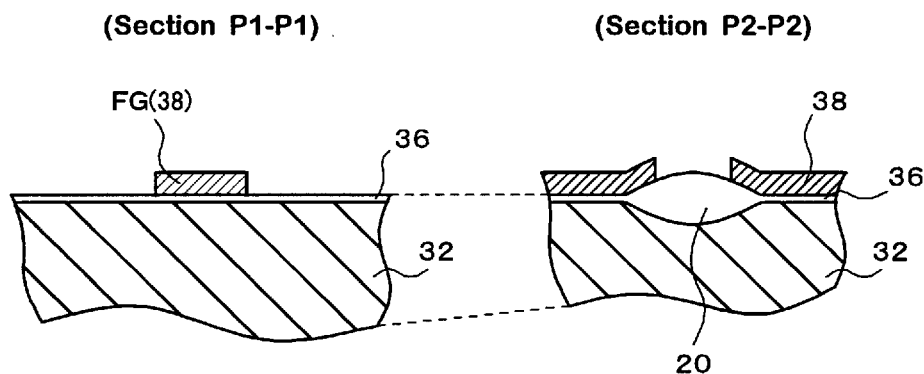
FIG.1B (Section P1-P1) (Section P2-P2)
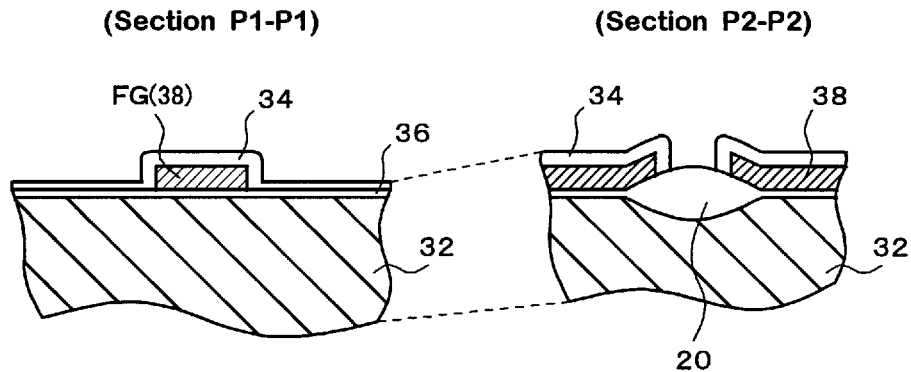
FIG.1C (Section P1-P1)
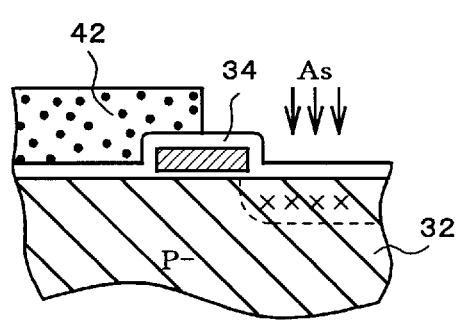
20: Locos
34: inter layer
38: polysilicon layer
FG: floating gate FIG.3A (Section P1-P1)
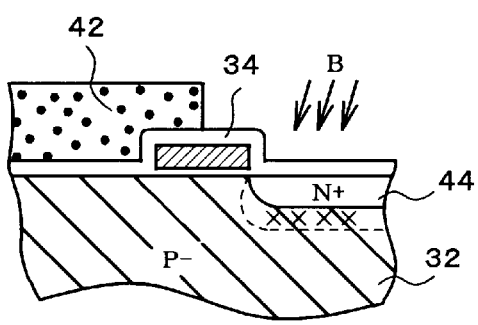
FIG.3B (Section P1-P1) (Section P2-P2)
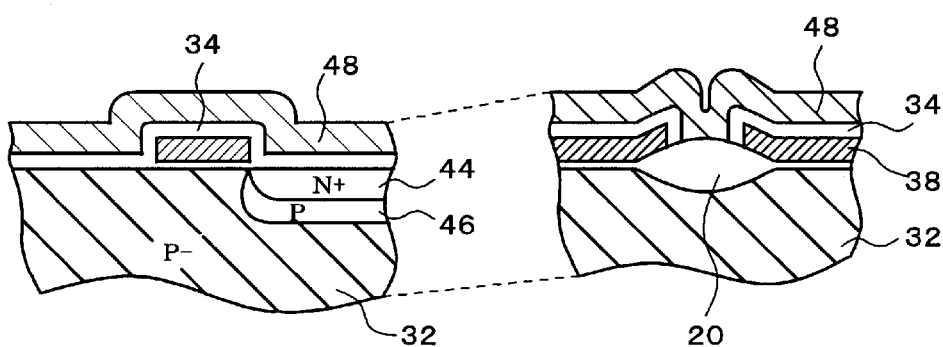
FIG.3C (Section P1-P1)
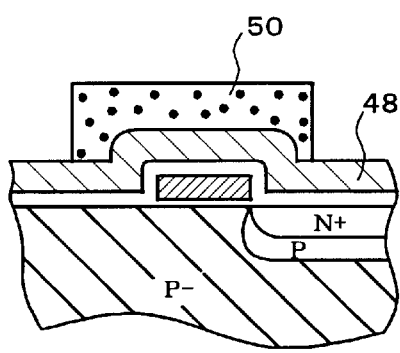

METHOD FOR MANUFACTURING A SEMICONDUCTOR DEVICE

BACKGROUND OF THE INVENTION

1. Field of the Invention

The present invention relates to a method for manufacturing a semiconductor device, more specifically a manufacturing method for a semiconductor device comprising a step for forming a second layer on the first layer, the second layer having a lower rate of etching than the first layer, a step for carrying out selective etching to a part of the second layer, a step for forming a conductive layer upward of the second layer, and a step for carrying out selective etching to a part of the conductive layer corresponding to the part of the second layer being etched selectively.

2. Description of the Related Art

A programmable logic device (hereinafter referred to as PLD) is known as a large scale integrated circuit capable of programing logic functions by the user(s). The PLD is constructed so as to provide a number of logic circuits ready-to-operate on the chip for the LSI, and the logic circuits are connected to one another through switches capable of programming. A switching element SW shown in FIG. 5A is considered as one of switches for the PLD.

The switching element SW is constructed by connecting both of a transistor TR1 for programming and a transistor TR2 for switching with each other as shown in FIG. 5A. The transistor TR1 for programming is a split gate type electrically programmable read only memory (EPROM). Also, floating gates FG of the transistor TR1 for programming and the transistor TR2 for switching are formed continuously in common with each other. Control gates CG of both the transistor TR1 and the transistor TR2 are formed continuously in common with each other.

Either of information ON or OFF is written in the transistor TR1 by applying appropriate voltages to a terminal ES, a terminal ED and the control gate CG. The transistor TR2 connects or disconnects a wiring L1 and L2 in accordance with the information written in the transistor TR1.

FIG. 5B and 5C are sectional views showing structures of the transistor TR1 for programming and the transistor TR2 for switching respectively. Also, FIG. 6 is a plan view showing planar structure of the switching elements SW, providing four of them continuously.

A part of the manufacturing processes of the switching element SW (sectional views taken on the planes of the line of P1—P1 and that of the line of P2—P2 in FIG. 6) are shown in FIGS. 7A, 7B, 7C and FIGS. 8A, 8B and 8C. In order for manufacturing the switching element SW, a semiconductor-substrate 2 being formed both of a gate oxidation layer 4 and a polysilicon layer 6 is prepared.

Thereafter, a floating gate FG is formed by carrying out anisotropic etching (see FIGS. 7B and 7C) after performing patterning of a resist layer 8 (see FIG. 7A).

Then, an inter layer 12 is formed by oxidizing both the surface of the semiconductor-substrate 2 and the floating gate FG (see FIG. 8A). After forming the inter layer 12, a polysilicon layer 14 is formed. The polysilicon layer is patterned by a resist layer 16 (see FIG. 8B).

Further, a control gate CG is formed by carrying out anisotropic etching by using the resist layer 16 as a mask (see FIG. 8C). Thus, the switching element SW is manufactured.

However, the manufacturing processes of the switching element SW described above have the following problems to be resolved. The floating gate FG is formed by carrying out anisotropic etching to the polysilicon layer 6 (see FIG. 7B) first, and then wet-etching is performed at the final phase (see FIG. 7C).

During the final phase of the etching processes, a silicon oxidation layer for separating the elements formed by the method of a local oxidation of silicon (hereinafter referred to as LOCOS layer 20) is etched at a much higher speed than that of the polysilicon layer 6, because the LOCOS layer 20 has a higher rate of etching than that of the polysilicon layer 6. As a result, as shown in the section P2—P2 of FIG. 7C, the polysilicon layer 6 remains in a shape of eaves on the LOCOS layer 20 thus etched.

Not much of an inter layer 12 is formed on the LOCOS layer 20 when the inter layer 12 is formed by oxidizing both the surface of the semiconductor-substrate 2 and the polysilicon layer 6 (floating gate FG) (see FIG. 8A), because the rate of forming an oxidation layer of the LOCOS layer 20 is lower than that of the polysilicon layer 6.

Consequently, a larger size of the inter layer 12 is formed in a shape of eaves 12a on the LOCOS layer 20 as shown in the section P2—P2 of FIG. 8A.

Therefore, as shown in the section P2—P2 of FIG. 8B, a polysilicon layer 14 is formed so as to get underneath the eaves 12a when the polysilicon layer 14 is accumulated on the inter layer 12.

As a result of that, as shown in the section P2—P2 of FIG. 8C, the polysilicon layer 14 formed underneath the eaves 12a can not be removed completely even when the polysilicon layer 14 formed on the LOCOS layer 20 is removed by anisotropic etching. The polysilicon layer 14 thus remaining underneath the eaves 12a is referred to as stringers 22 (illustrated by chain double dashed line in FIG. 6).

As shown in FIG. 6, both of the control gates CG are connected electrically which must be electrically insulated from each other. So that, the stringers 22 might be a cause of erroneous operation of the switching element SW.

SUMMARY OF THE INVENTION

It is an object of the present invention to provide a method for manufacturing a semiconductor device in which it is hard to cause stringers. In other words, to resolve the disadvantages of the method for manufacturing a semiconductor device such as switching element SW or the like in the related art described in the above.

In accordance with characteristics of the present invention, a method for manufacturing a semiconductor device comprising steps of:

step for preparing a semiconductor substrate, step for forming a first layer on the semiconductor substrate, a step for forming a second layer on the first layer, the second layer having a lower rate of etching than the first layer, a step for carrying out selective etching to a part of the second layer, a step for forming a conductive layer at upward of the second layer, and a step for carrying out selective etching to a part of the conductive layer corresponding to the part of the second layer being etched selectively, characterized in that, conditions for carrying out selective etching to the second layer are determined so as to not etch the first layer.

Also, in accordance with characteristics of the present invention, a method for manufacturing a semiconductor device having a plurality of elements arranged in a matrix configuration consisting of rows and columns, the element comprising:

a semiconductor substrate, a lower insulation layer, a lower conductive layer having a lower rate of etching than the lower insulation layer, and having a higher rate of formation of oxidation layers than the lower insulation layer, an upper insulation layer formed by a silicon oxidation layer, and an upper conductive layer, wherein the element is formed by accumulating the lower insulation layer, the lower conductive layer, the upper insulation layer and the upper conductive layer in that order on the semiconductor substrate, and wherein each of the columns of the matrix is electrically separated from each other by a silicon oxidation layer for element separation, and wherein the upper conductive layer of the element composing a same row is connected to each other across the silicon oxidation layer for element separation, and wherein each of the upper conductive layers belonging to different rows are electrically separated from each other, characterized in that, the method comprising steps of:

a step for forming the lower insulation layer and the lower conductive layer on the semiconductor substrate, a step for removing only the lower conductive layer partially by carrying out etching, a step for forming the upper insulation layer by growing the silicon oxidation layer, a step for forming the upper conductive layer at upward of the upper insulation layer, and a step for removing the upper conductive layer partially by carrying out etching.

While the novel features of the invention are set forth in a general fashion, both as to organization are content, it will be better understood and appreciated, along with other objects and features thereof, from the following detailed description taken in conjunction with the drawings.

BRIEF DESCRIPTION OF THE DRAWINGS

FIG. 1A, FIG. 1B and FIG. 1C are views showing a part of manufacturing processes of a switching element using a transistor as a manufacturing method of a semiconductor device in an embodiment of the present invention.

FIG. 3A, FIG. 3B and FIG. 3C are views showing a part of manufacturing processes of the switching element using a transistor in an embodiment of the present invention.

DESCRIPTION OF THE PREFERRED EMBODIMENT

A part of manufacturing processes of a switching element using a transistor in an embodiment of the present invention is shown in FIGS. 2A, 2B and 2C, FIGS. 1A, 1B and 1C, FIGS. 3A, 3B and 3C and FIGS. 4A, 4B and 4C. The switching element SW has the same structure with the switching element shown in FIGS. 5A, 5B and 5C and FIG. 6. In other words, the switching element SW is a switching element using both of a transistor TR1 for programming and a transistor TR2 for switching, and the switching element SW is used as a switch of a field programmable gate array (hereinafter referred to as FPGA) which is a kind of the PLD.

Figure 2A:
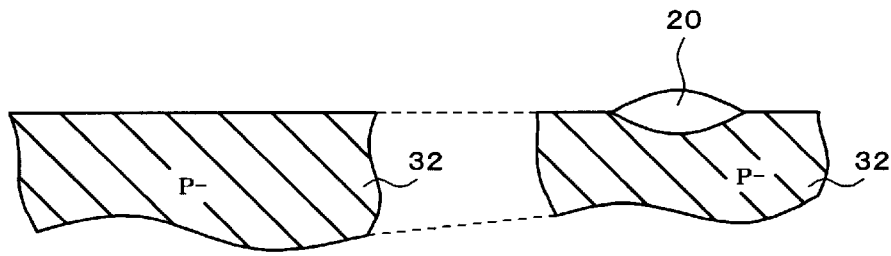
FIG. 2A, FIG. 2B and FIG. 2C are views showing a part of manufacturing processes of the switching element using a transistor in an embodiment of the present invention.

In order for manufacturing the switching element SW, a semiconductor-substrate 32 shown in FIG. 2A is prepared. The section P1—P1 shows an element formation region where the transistor Tr1 is to be formed, and the section P2—P2 shows an element separation region respectively. A LOCOS layer 20 (a first layer) as a silicon oxidation layer for separating the elements is formed in the element separation region.

Figure 2B:
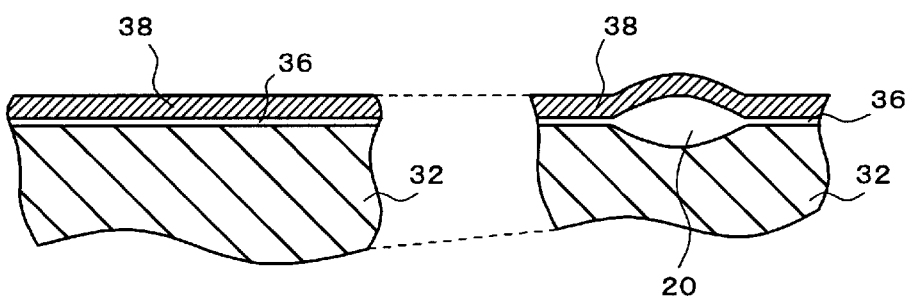
Figure 2C:
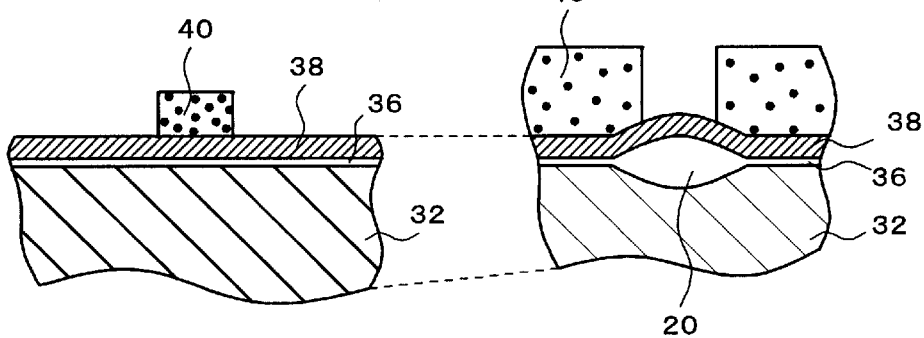

Thereafter, as shown in FIG. 2B, a gate oxidation layer 36 as the first layer (a layer made of silicon oxide, a lower insulation layer) is formed on the semiconductor-substrate 32 by means of thermal oxidation method or similar method. Then, a polysilicon layer 38 as the second layer (a layer including silicon, a lower conductive layer) is formed on both of the gate oxidation layer 36 and the LOCOS layer 20 by chemical vapor deposition method or the like. Further to that, as shown in FIG. 2C, patterning of the polysilicon layer 38 is carried out after forming a photo-resist layer 40 on the polysilicon layer 38. In other words, the polysilicon layer 38 is selectively etched by carrying out anisotropic etching using the photo-resist layer 40 as a mask. Thus, a floating gate FG shown in FIG. 1A is formed. In the anisotropic etching, a part of the polysilicon layer 38 formed on the LOCOS layer 20 is removed.

Figure 7A:
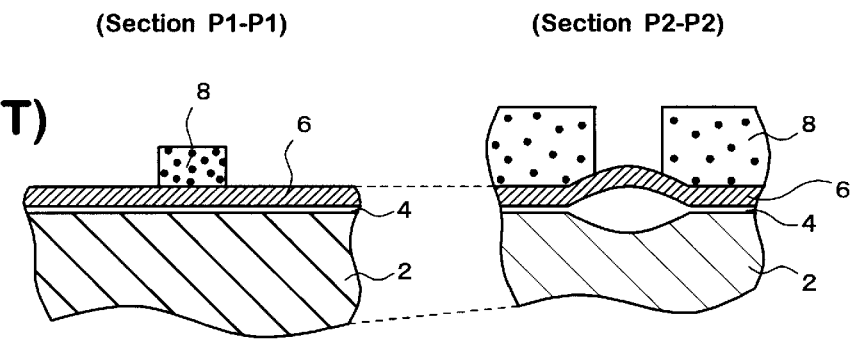
FIG. 7A, FIG. 7B and FIG. 7C are the views showing a part of manufacturing processes of a transistor before the improvement achieved by present invention is done.
Figure 7B:
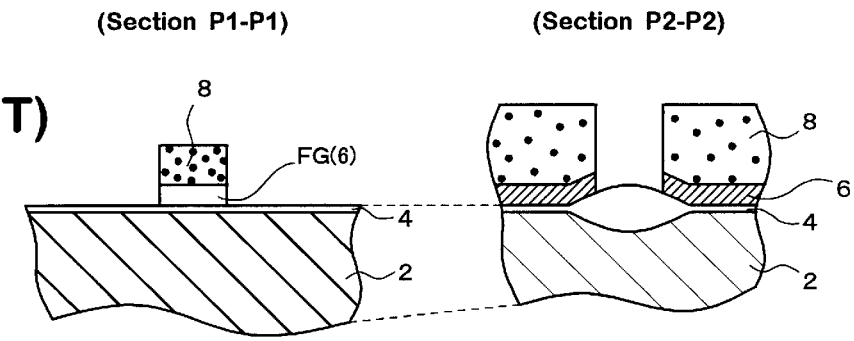
Figure 7C:
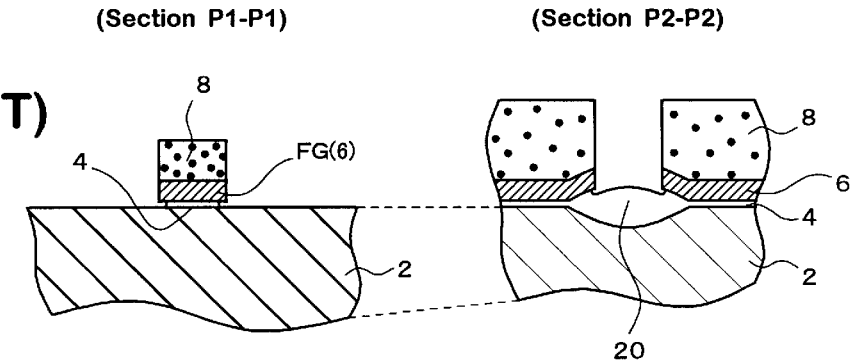

During the anisotropic etching, the etching is stopped when only the polysilicon layer 38 is removed. So that, both the gate oxidation layer 36 and the LOCOS layer 20 remains on the semiconductor-substrate 32. In this case, wet-etching usually carried out at the final phase of the anisotropic etching process is not performed. As a result, the LOCOS layer 20 located underneath the polysilicon layer 38 is not over-etched as shown in FIG. 7C, because the wet-etching is not carried out. Therefore, the polysilicon layer 38 does not remain In a shape of eaves on the LOCOS layer 20.

Thereafter, an inter layer 34 as the third layer (an upper insulation layer) is formed by oxidizing both the surface of the gate oxidation layer 36 and the polysilicon layer 38. The inter layer 34 has a tendency of growth as follows. The inter layer 34 grows thickly at a part facing the polysilicon layer 38, and the growth of the inter layer 34 at a part facing to the LOCOS layer 20 becomes slower than that of others. Also, the inter layer 34 grows thinly at a part facing to the gate oxidation layer 36. The polysilicon layer 38 has a high formation rate of oxidation layers, the LOCOS layer 20 has a low formation rate of the oxidation layers, and the gate oxidation layer 36 has a mediocre rate of the oxidation layers.

The oxidation layers are formed relatively thick where the inter layer 34 is facing the gate oxidation layer 36, because the thickness of the oxidation layers becomes; the sum total of thickness for both of the layers. However, the thickness of the oxidation layers does not become a disadvantage in practical use.

Since, the polysilicon layer 38 is not formed in a shape of eaves on the LOCOS layer 20 as in the previous process, there is less possibility to form the inter layer 34 in a shape of eaves on the LOCOS layer 20.

Further to that, as shown in FIG. 1C, patterning of the inter layer 40 is carried out after forming a photo-resist layer 34 on the inter layer 34. An N$^+$ region is formed by implanting arsenic to the semiconductor-substrate 32 jonically by using the photo-resist layer 42 as a mask as shown in FIG. 1C. The N$^+$ region thus formed becomes a drain region 44. A positive region (hereinafter referred to as P region) 46 is formed by implanting boron with energy of penetrating the drain region 44 as shown in FIG. 1A. Formation of the P region increases characteristics of writing of the transistor TR1.

Thereafter, a polysilicon layer 48 as a conductive layer (an upper conductive layer) is formed over the entire surface of the semiconductor-substrate 32 by means of chemical vapor deposition method as shown in FIG. 3B. Further to that, a photo-resist layer 50 is formed on the polysilicon layer 48 as shown in FIG. 3C, and then a control gate CG is formed by carrying out anisotropic etching using the photo-resist layer 50 as a mask as shown in FIG. 4A.

Figure 4A:
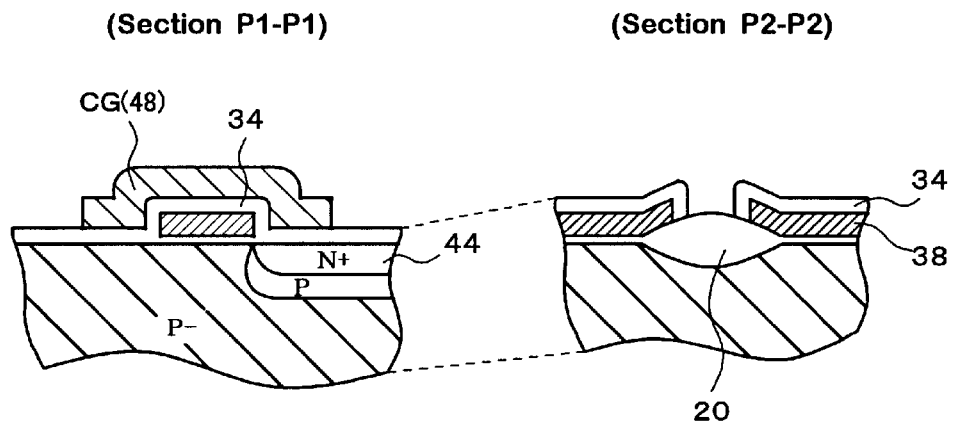
FIG. 4A, FIG. 4B and FIG. 4C are views showing a part of manufacturing processes of the switching element using a transistor in an embodiment of the present invention.
Figure 8A:
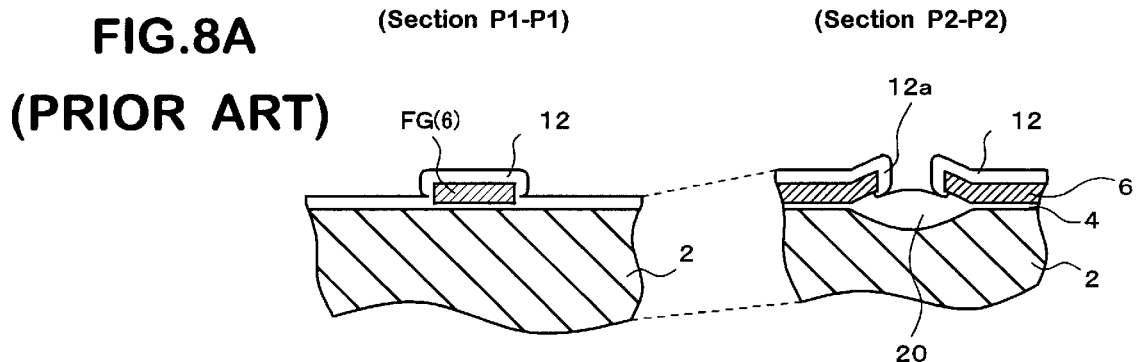
FIG. 8A, FIG. 8B and FIG. 8C are the views showing a part of manufacturing processes of a transistor before the improvement achieved by present invention is done.
Figure 8B:
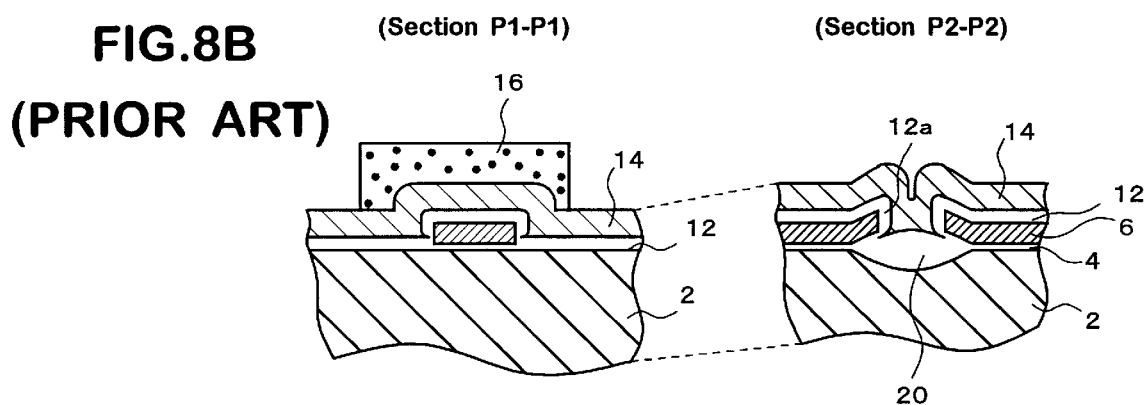
Figure 8C:
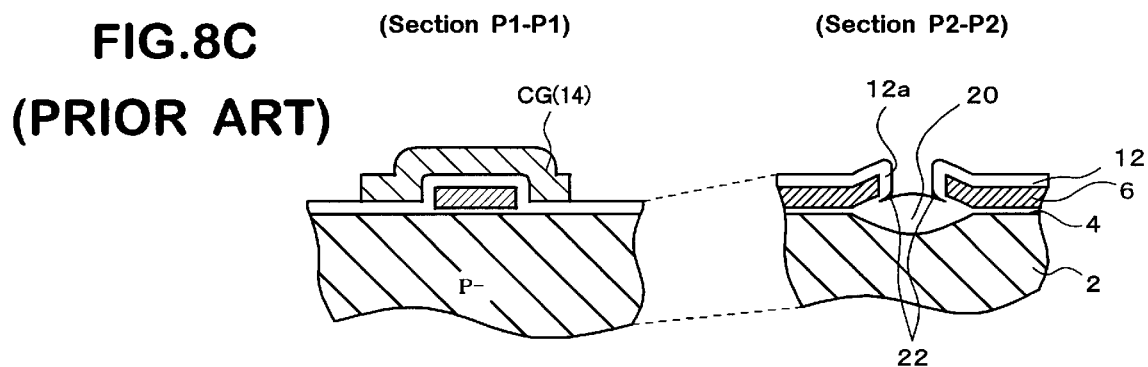

During the anisotropic etching, the polysilicon layer 48 formed on the LOCOS layer 20 is also removed as shown in a section P2—P2 in FIG. 4A. However, stringers 22 (see FIG. 8C and FIG. 6) are not formed underneath the inter layer 34, because the inter layer 34 is not formed in a shape of eaves on the LOCOS layer 20 under the process shown in FIG. 1B.

Figure 5B:
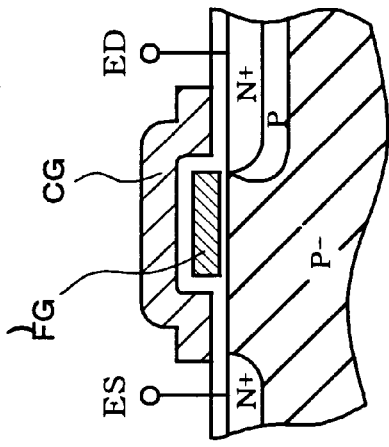
FIG. 5B is a sectional view showing a transistor for programming.
Figure 5C:
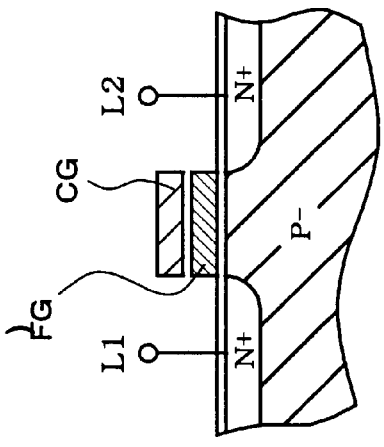
FIG. 5C is a sectional views showing a transistor for switching.
Figure 5A:
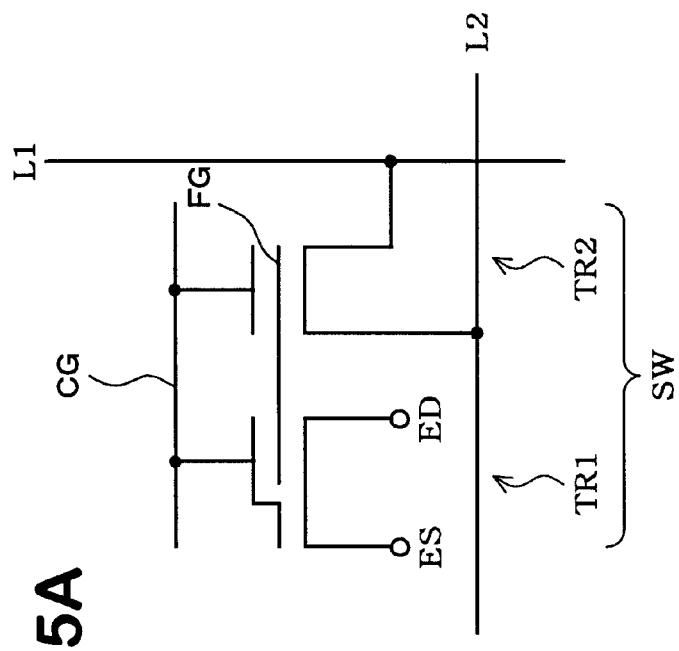
FIG. 5A is a circuit diagram of the switching element using a transistor.
Figure 6:
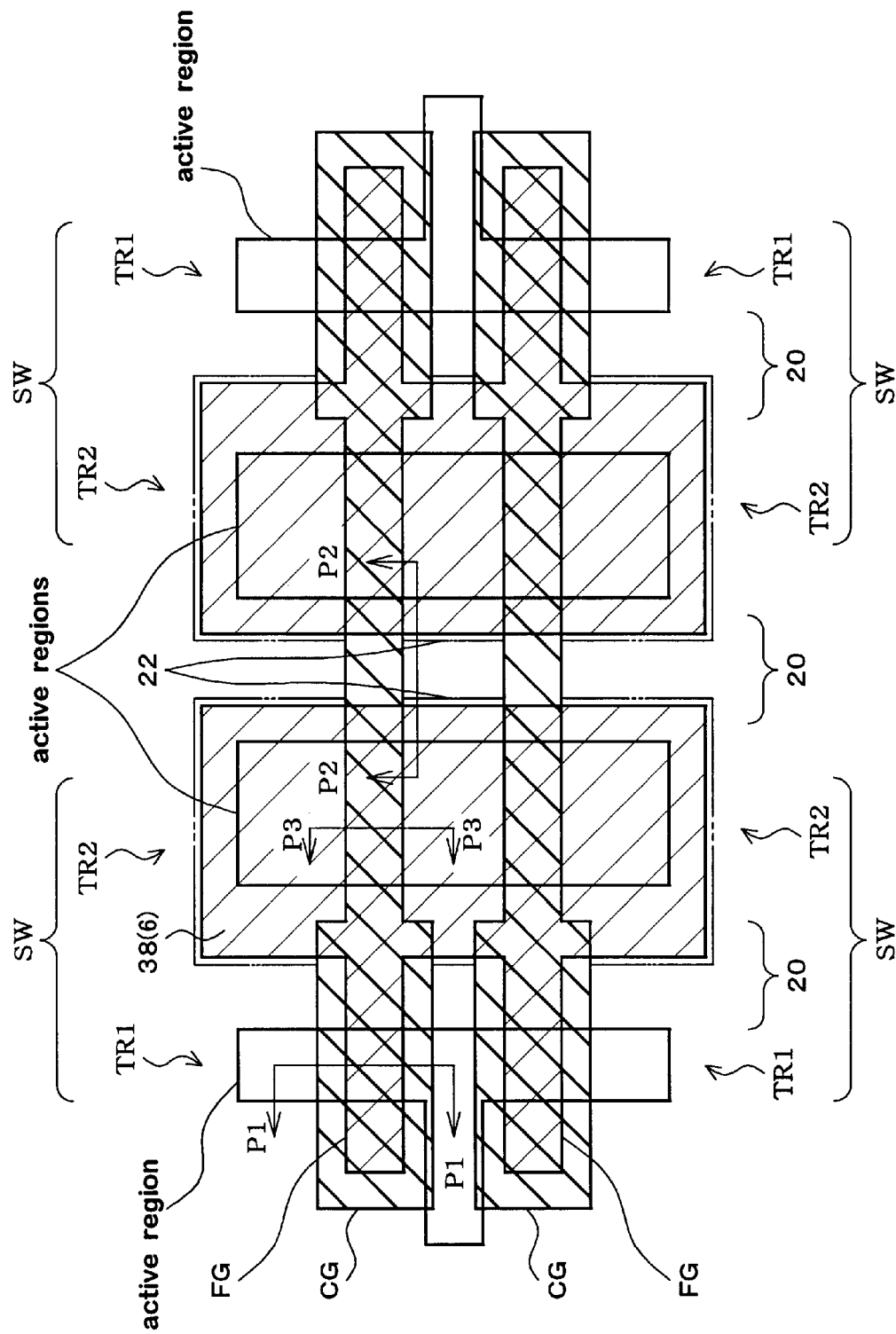
FIG. 6 is a plan view showing planar structure of the switching elements, providing four of them continuously.

FIG. 6 is a plan view showing planar structure of the switching elements under the process shown in FIG. 4A. The floating gate FG of the transistor TR2 shown in FIG. 5C is formed by removing a part of the polysilicon layer 38 projected over the floating gate FG.

Figure 4B:
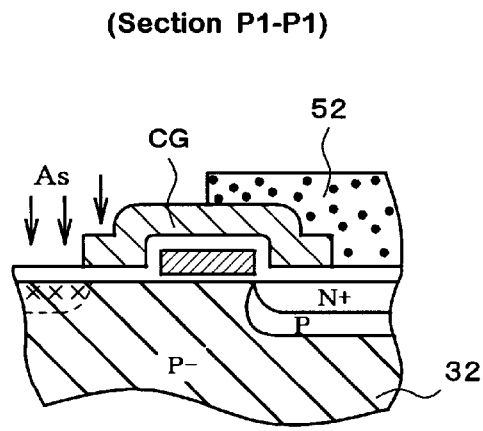
Figure 4C:
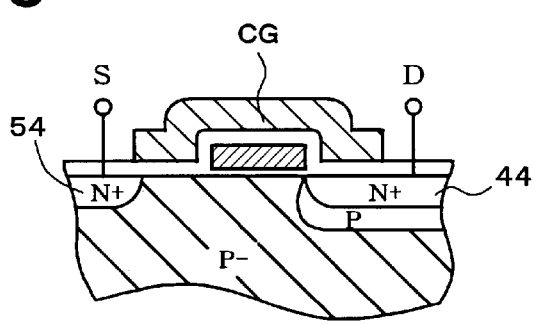

Next, as shown in FIG. 4B, a photo-resist layer 52 is formed on a part of the surface, and arsenic is implanted into the semiconductor-substrate 32 using the photo-resist layer 52 as a mask. As a result, another N$^+$ region which becomes a source region 54 is formed as shown in FIG. 4C. Further to that, both of a source electrode S and a drain electrode D are connected to the source region 54 and the drain region 44 respectively. Thus, the switching element SW is completed.

The present invention is applied to a manufacturing processes of the switching element SW using transistors as switches of the FPGA which is a kind of the PLD in the embodiments described above. Application of the present invention is not limited to the switching element SW described above. It is possible to apply the present invention to a manufacturing method for the switching element of other devices used as a switching element such as a programmable logic array (PLA) as another kind of PLD, a switching element except for the PLD and semiconductor devices for general use (not for switching).

In the embodiment described above, the wet-etching process carried out at the final phase is omitted in order to remove only the polysilicon layer 38 partially. Other methods such as adjusting acceleration energy of the anisotropic etching can also be used as a process for removing only the polysilicon layer 38 partially.

Although both the gate oxidation layer 36 and the LOCOS layer 20 are used as an example of the first layer in the embodiment described above, the present invention can be applied when other layers made of silicon oxide are used as the first layer. Further, the invention can also be applied when the first layer is made of other material than the silicon oxide.

Although the polysilicon layer 38 is used as an example of the second layer in the embodiment described above, the present invention can be applied when the other conductive layer including silicon such as a poly-cide, sili-cide or the like is used as the second layer. Further, the present invention can also be applied when an aluminum wiring layer is made as the second layer. Still further, the present invention can be applied when the second layer is made of a material other than a conductive substance.

Also, the second layer in the embodiment is made of a layer easy to form silicon oxidation layers on it, in comparison to the first layer. The present invention is not limited to use for the second layer.

Also, the third layer (the inter layer 34) is formed between the second layer and the conductive layer in the embodiment described above. The present invention can also be applied to a semiconductor device which does not have the third layer.

Further, the polysilicon layer 48 is used as an example of the conductive layer in the embodiment described above, the present invention can be applied when one of poly-cide, sili-cide and an aluminum wiring layer or the like is used as the conductive layer.

The present invention is characterized in that, conditions for carrying out selective etching to the second layer are determined so as to not etch the first layer.

In this way, the first layer is not etched when partial etching of the second layer is carried out. Therefore, the second layer does not remain in a shape of eaves on the first layer. As a result, the conductive layer does not remain underneath the second layer when the conductive layer is removed by carrying out etching after forming the conductive layer. In other words, the probability of causing stringers is remarkably low.

Also, the present invention is characterized in that, the second layer is made so as to form a silicon oxidation layer on the surface of the second layer easily in comparison with formation of the silicon oxidation layer on the surface of the first layer, and a third layer is formed upward of the second layer by growing the silicon oxidation layer prior to forming the conductive layer, after carrying out selective etching to a part of the second layer.

In this way, the third layer does not grow in a shape of eaves on the first layer, even when the silicon oxidation layer grows on the surface of both the first layer and the second layer. As a result of that, the conductive layer does not remain underneath the third layer when the conductive layer is removed by carrying out etching after forming the conductive layer. In other words, the probability of causing stringers is remarkably low.

Further, the present invention is characterized in that, the method for manufacturing the semiconductor device is composed so as not to carry out etching to the first layer by omitting wet-etching performed at the last phase of anisotropic etching process.

Thus, it is possible to prevent carrying out etching to the first layer even when the second layer is removed by anisotropic etching. In other words, the probability of causing stringers is remarkably low in this case also.

Still further, the present invention is characterized in that, the method for manufacturing a semiconductor device comprises steps of, a step for forming the lower insulation layer and the lower conductive layer on the semiconductor substrate, a step for removing only the lower conductive layer partially by carrying out etching, a step for forming the upper insulation layer by growing the silicon oxidation layer, a step for forming the upper conductive layer at upward of the upper insulation layer, and a step for removing the upper conductive layer partially by carrying out etching.

In this way, occurrence of the stringers can be suppressed even when the switching elements SW using transistors are used as switches for the PLD. In other words, the upper conductive layer which should be separated electrically from each other is not connected by the stringers unintentionally. Further, contacts for wiring are not short-circuited by the stringers.

Although the invention has been described in its preferred form with a certain degree of particularity, it is understood that the present disclosure of the preferred form may be changed in the details of its construction and any combination and arrangement of parts may be resorted to without departing from the spirit and the scope of the invention as hereinafter claimed.

What is claimed is:

1. A method for manufacturing a semiconductor device, said method forming first and second layers on a substrate such that an etchant used etches the second layer at a lower rate than the first layer said method comprising the steps of:
   a step for preparing the substrate,
   a step for forming the first layer on the substrate,
   a step for forming the second layer on the first layer,
   a step for carrying out selective etching with said etchant to a part of the second layer,
   a step for forming a conductive layer upward of the second layer, and
   a step for carrying out selective etching to a part of the conductive layer corresponding to the part of the second layer which was etched selectively,
   characterized in that, conditions for carrying out selective etching to the second layer are determined so that the first layer is not etched.

2. A method for manufacturing a semiconductor device in accordance with claim 1,
   wherein the second layer has a tendency to form a silicon oxidation layer easier on the surface of the second layer than formation of the silicon oxidation layer on the surface of the first layer,
   and wherein a third layer is formed upward of the second layer by growing the silicon oxidation layer prior to forming the conductive layer, and after carrying out selective etching to a part of the second layer.

3. A method for manufacturing a semiconductor device in accordance, with claim 2,
   wherein the first layer is a layer made of silicon oxide,
   and wherein the second layer is a layer made of a conductive material which contains silicon.

4. A method for manufacturing a semiconductor device in accordance with claim 3,
   wherein the second layer is made of polysilicon.

5. A method for manufacturing a semiconductor device in accordance with claim 3,
   wherein the second layer is made of silicide.

6. A method for manufacturing a semiconductor device in accordance with claim 3,
   wherein the second layer is made of poly-cide.

7. A method for manufacturing a semiconductor device in accordance with claim 2,
   wherein the second layer is made of an aluminum wiring layer.

8. A method for manufacturing a semiconductor device in accordance with claim 1,
   wherein the second layer is either an insulator or a semiconductor.

9. A method for manufacturing a semiconductor device in accordance with claim 1,
   wherein the conductive layer is made of polysilicon.

10. A method for manufacturing a semiconductor device in accordance with claim 1,
    wherein the conductive layer is made of silicide.

11. A method for manufacturing a semiconductor device in accordance with claim 1,
    wherein the conductive layer is made of polycide.

12. A method for manufacturing a semiconductor device in accordance with claim 1,
    wherein the conductive layer is made of an aluminum wiring layer.

13. A method for manufacturing a semiconductor device in accordance with claim 1,
    wherein the step for carrying out selective etching to a part of the second layer is defined as the anisotropic etching process,
    and wherein the anisotropic etching process is composed so as not to carry out etching to the first layer by omitting wet-etching performed at the last phase of the anisotropic etching process, with carrying out selective etching of a part of the second layer.

14. A method for manufacturing a semiconductor device having a plurality of elements arranged in a matrix configuration consisting of rows and columns, the device comprising:
    a semiconductor substrate,
    a lower insulation layer,
    a lower conductive layer such that an etchant used etches the lower conductive layer at a lower rate of etching than the lower insulation layer, said lower conductive layer having a higher rate of formation of oxidation layers than the lower insulation layer,
    an upper insulation layer formed by a silicon oxidation layer, and
    an upper conductive layer,
    wherein each element is formed by accumulating the lower insulation layer, the lower conductive layer, the upper insulation layer and the upper conductive layer in that order on the semiconductor substrate,
    and wherein each of the columns of the matrix is electrically separated from each other by a silicon oxidation layer for element separation,
    and wherein the upper conductive layer of the device composing a same row connects across the silicon oxidation layer for element separation, and wherein each of the upper conductive layers belonging to different rows are electrically separated from each other, characterized in that, the method comprising the steps of:

a step for forming the lower insulation layer and the lower conductive layer on the semiconductor substrate, a step for removing only the lower conductive layer partially by carrying out etching with said etchant, a step for forming the upper insulation layer by growing the silicon oxidation layer, a step for forming the upper conductive layer upward of the upper insulation layer, and a step for removing the upper conductive layer partially by carrying out etching.

15. A method for manufacturing a semiconductor device in accordance with claim 14, wherein the lower insulation layer is made of silicon oxide.

16. A method for manufacturing a semiconductor device in accordance with claim 15, wherein a gate oxidation layer is formed as the lower insulation layer, and wherein a local oxidation of silicon (LOCOS) layer is formed as the silicon oxidation layer for separating elements.

17. A method for manufacturing a semiconductor device in accordance with claim 15, wherein the lower conductive layer is made of polysilicon.

18. A method for manufacturing a semiconductor device in accordance with claim 14, wherein the upper conductive layer is made of polysilicon.

19. A method for manufacturing a semiconductor device in accordance with claim 14, wherein the step for removing only the lower conductive layer partially by carrying out etching is defined as the anisotropic etching process, and wherein the anisotropic etching process is composed so as not to carry out etching to the lower insulation layer by omitting wet-etching performed at the last phase of anisotropic etching process, while carrying out selective etching of a part of the lower conductive layer.

20. A method for manufacturing a semiconductor device in accordance with claim 14, wherein the element is a switching element having a transistor comprising:

a gate oxidation layer corresponding to the lower insulation layer, a floating gate corresponding to the lower conductive layer, an inter layer corresponding to the upper insulation layer, and a control gate corresponding to the upper conductive layer.

* * * * *